(12) United States Patent
Mulder et al.

(10) Patent No.: US 9,812,042 B2
(45) Date of Patent: Nov. 7, 2017

(54) LIGHTED TRIM ASSEMBLY AND PERFORATED MEMBER THEREFOR

(71) Applicants: Innotec, Corp., Zeeland, MI (US); Vestatec (U.K.) Limited, Slough, Berkshire (GB)

(72) Inventors: Jason R. Mulder, Zeeland, MI (US); David L. Hiemstra, Hudsonville, MI (US); Antony John Skirrow, Nottingham (GB)

(73) Assignees: Innotec Corp., Zeeland, MI (US); Vestatec (U.K.) Limited, Berkshire (GB)

(*) Notice: Subject to any disclaimer, the term of this patent is extended or adjusted under 35 U.S.C. 154(b) by 349 days.

(21) Appl. No.: 14/065,005

(22) Filed: Oct. 28, 2013

(65) Prior Publication Data

US 2014/0119038 A1    May 1, 2014

Related U.S. Application Data

(60) Provisional application No. 61/719,788, filed on Oct. 29, 2012, provisional application No. 61/830,403, filed on Jun. 3, 2013.

(51) Int. Cl.
*H01B 13/00* (2006.01)
*B44C 1/22* (2006.01)
(Continued)

(52) U.S. Cl.
CPC ............ *G09F 13/06* (2013.01); *B21D 28/00* (2013.01); *B21D 28/24* (2013.01); *B21D 28/26* (2013.01);
(Continued)

(58) Field of Classification Search
None
See application file for complete search history.

(56) References Cited

U.S. PATENT DOCUMENTS 3,679,500 A * 7/1972 Kubo ............... B41J 2/1433
216/100
5,395,718 A  3/1995 Jensen et al.
(Continued)

FOREIGN PATENT DOCUMENTS

CN    1996148 A    7/2007
CN   201246654 Y    5/2009
(Continued)

OTHER PUBLICATIONS

International Search Report, PCT/US2013/067080, dated Feb. 13, 2014, 9 pages.
(Continued)

*Primary Examiner* — Stephanie Duclair
(74) *Attorney, Agent, or Firm* — Price Heneveld LLP

(57) ABSTRACT

A lighted assembly includes a perforated member having a plurality of relatively small openings therethrough. The openings are arranged to provide areas forming letters, designs, or the like. A light source may be positioned adjacent the perforated member whereby light from the light source travels through the openings to form illuminated letters, designs or the like. The perforations may be filled with a light-transmitting polymer material. The light source may comprise an LED and a light guide that distributes light along a lower side of the perforated member. The light source may be positioned in a waterproof housing that is sealed to the perforated member.

21 Claims, 6 Drawing Sheets

(51) Int. Cl.
    *B23P 15/00* (2006.01)
    *C03C 25/00* (2006.01)
    *C23F 1/00* (2006.01)
    *G09F 13/06* (2006.01)
    *B21D 28/24* (2006.01)
    *B21D 28/00* (2006.01)
    *B21D 28/26* (2006.01)
    *B60Q 1/32* (2006.01)
    *H01L 21/762* (2006.01)
    *B60R 3/00* (2006.01)
    *B60Q 3/64* (2017.01)
    *B60Q 3/217* (2017.01)

(52) U.S. Cl.
    CPC ........ B60Q 1/323 (2013.01); H01L 21/76224 (2013.01); *B60Q 3/217* (2017.02); *B60Q 3/64* (2017.02); *B60R 3/00* (2013.01); *H01L 21/76205* (2013.01); *Y10T 29/49002* (2015.01); *Y10T 428/24322* (2015.01)

(56) References Cited

U.S. PATENT DOCUMENTS

| | | | |
|---|---|---|---|
| 5,430,627 A | 7/1995 | Nagano | |
| 6,114,954 A * | 9/2000 | Palett | B60Q 1/2611 224/321 |
| 6,419,306 B2 | 7/2002 | Sano et al. | |
| 7,387,740 B2 * | 6/2008 | Lai | B44C 1/227 204/485 |
| 7,513,907 B2 | 4/2009 | Lau et al. | |
| 7,758,759 B2 | 7/2010 | James et al. | |
| 7,960,684 B2 * | 6/2011 | Payne | G06F 1/1616 250/227.26 |
| 2001/0027609 A1 | 10/2001 | Packham et al. | |
| 2004/0017687 A1 | 1/2004 | Misaras | |
| 2006/0114684 A1 | 6/2006 | Marquez | |
| 2006/0131602 A1 * | 6/2006 | Ouderkirk | H01L 33/642 257/100 |
| 2007/0133214 A1 | 6/2007 | Maeda et al. | |
| 2008/0024470 A1 * | 1/2008 | Andre | G09F 9/30 345/204 |
| 2008/0170405 A1 | 7/2008 | Kamiya et al. | |
| 2010/0186214 A1 * | 7/2010 | Judge | B60Q 1/2696 29/445 |
| 2011/0031126 A1 | 2/2011 | Wang et al. | |
| 2011/0048754 A1 | 3/2011 | Xiong et al. | |
| 2011/0151046 A1 * | 6/2011 | Simenson | B29D 11/00375 425/500 |
| 2012/0237725 A1 | 9/2012 | Stossel et al. | |

FOREIGN PATENT DOCUMENTS

| | | |
|---|---|---|
| DE | 4421942 A1 | 1/1996 |
| DE | 202004008681 U1 | 8/2004 |
| EP | 2028048 A1 | 2/2009 |
| EP | 2295293 A1 | 3/2011 |
| EP | 2406104 B1 | 1/2013 |
| GB | 905278 | 10/1960 |
| GB | 2290651 | 3/1996 |
| RU | 2280573 C1 | 7/2006 |
| WO | 02061380 A3 | 8/2002 |
| WO | 2007008104 A1 | 1/2007 |
| WO | 2011103692 A1 | 9/2011 |
| WO | 2012094640 A1 | 7/2012 |

OTHER PUBLICATIONS

UK Search Report, Application No. GB13190251, dated Jun. 3, 2014, 5 pages.

* cited by examiner

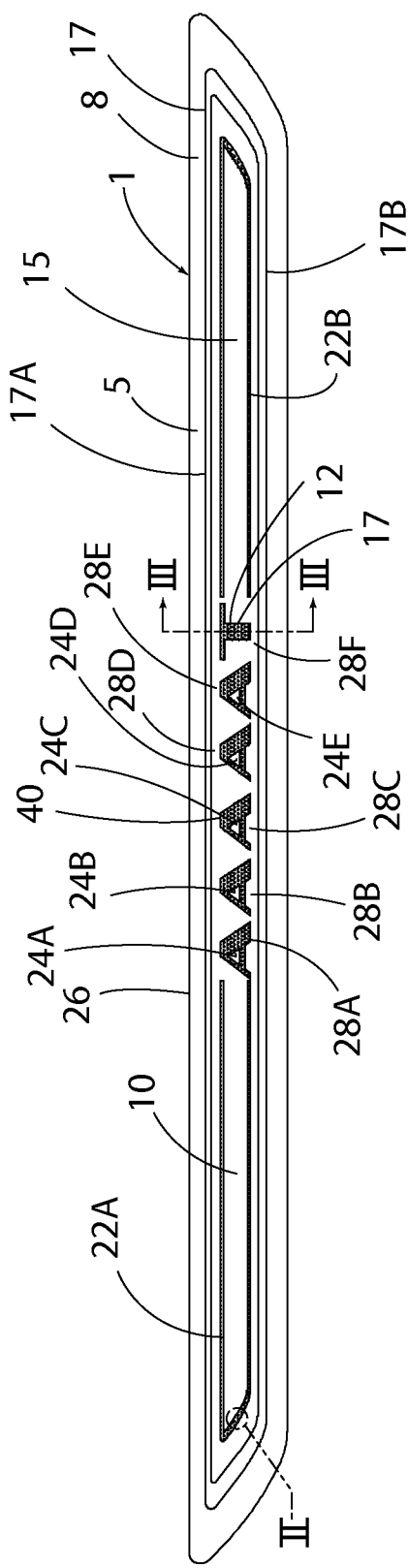
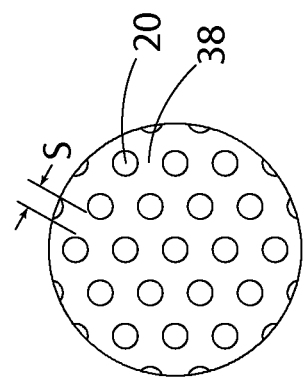
FIG.1
FIG.2

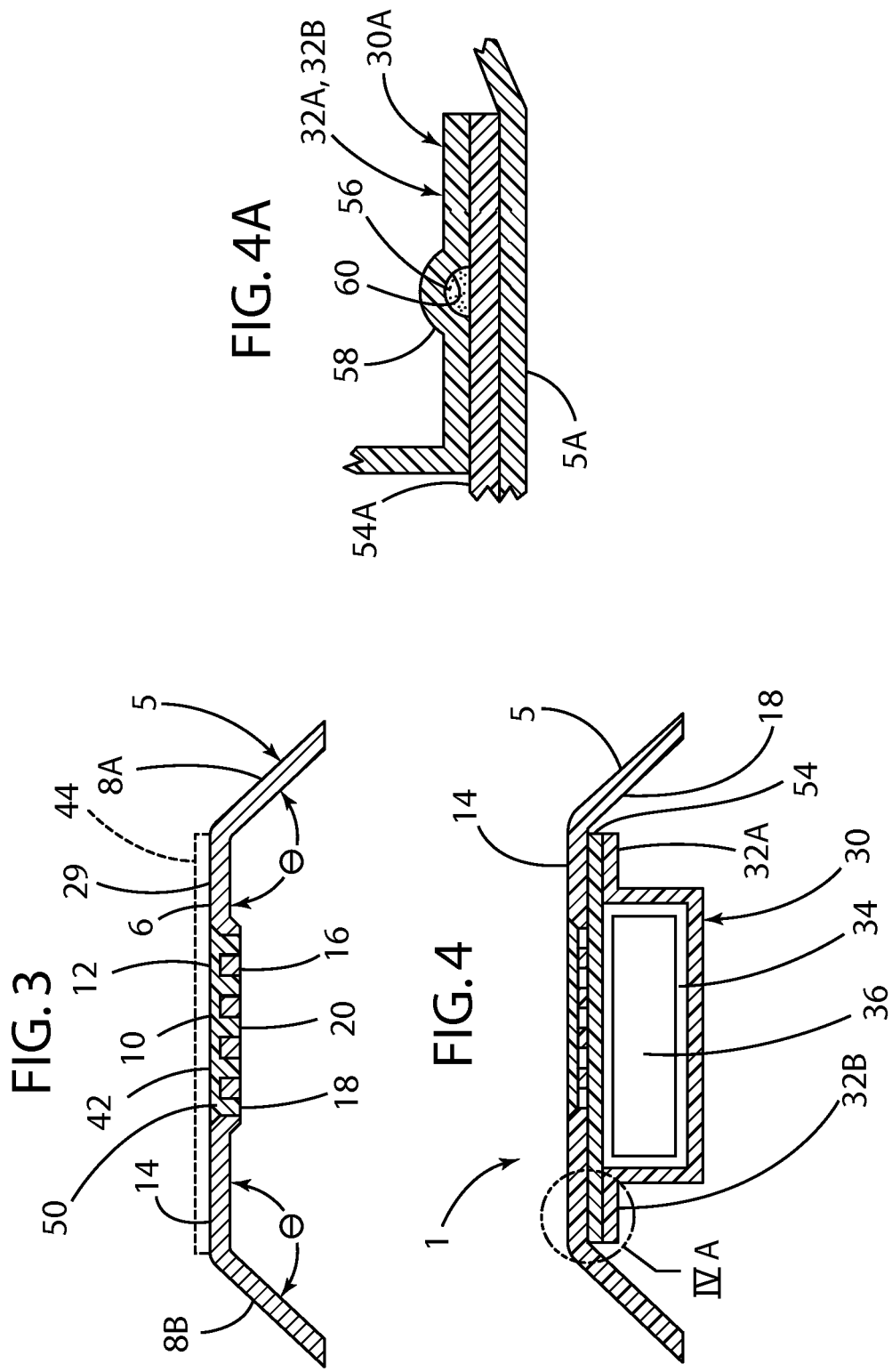

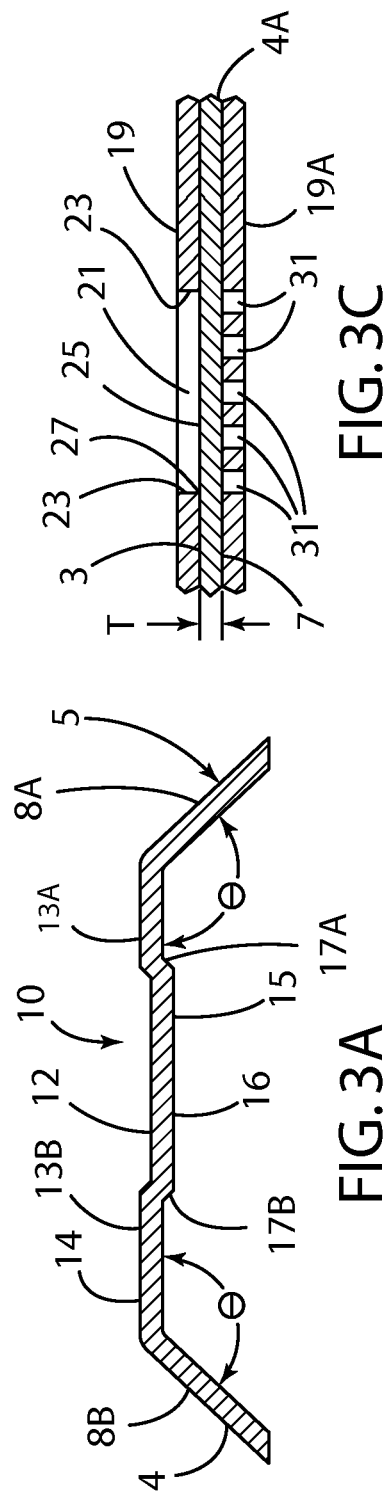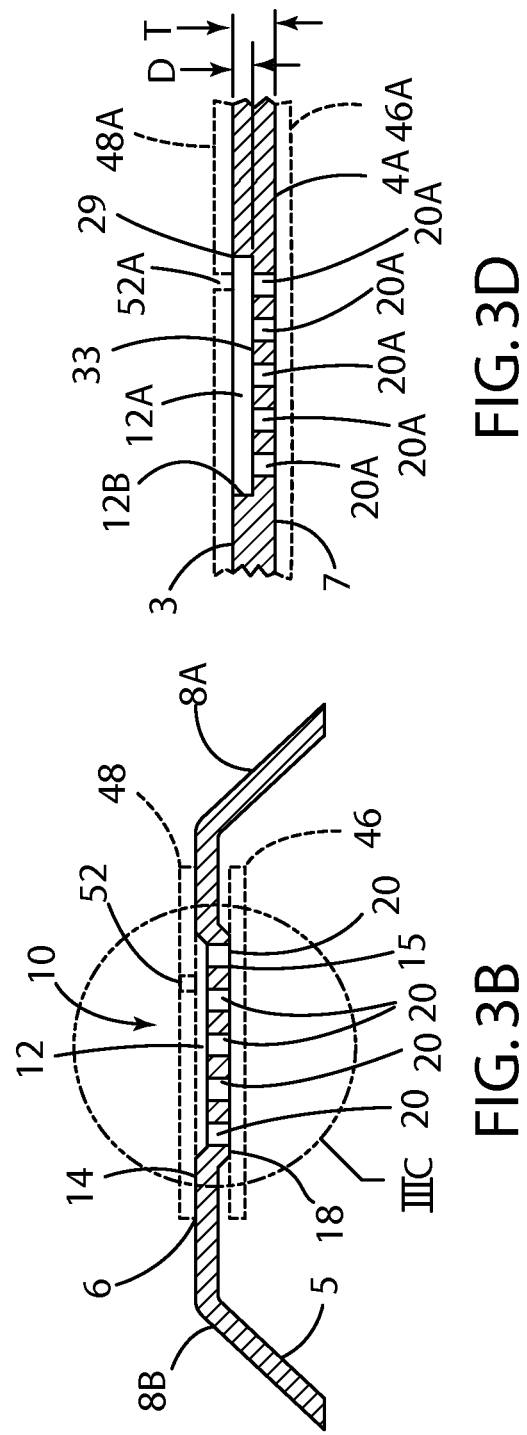

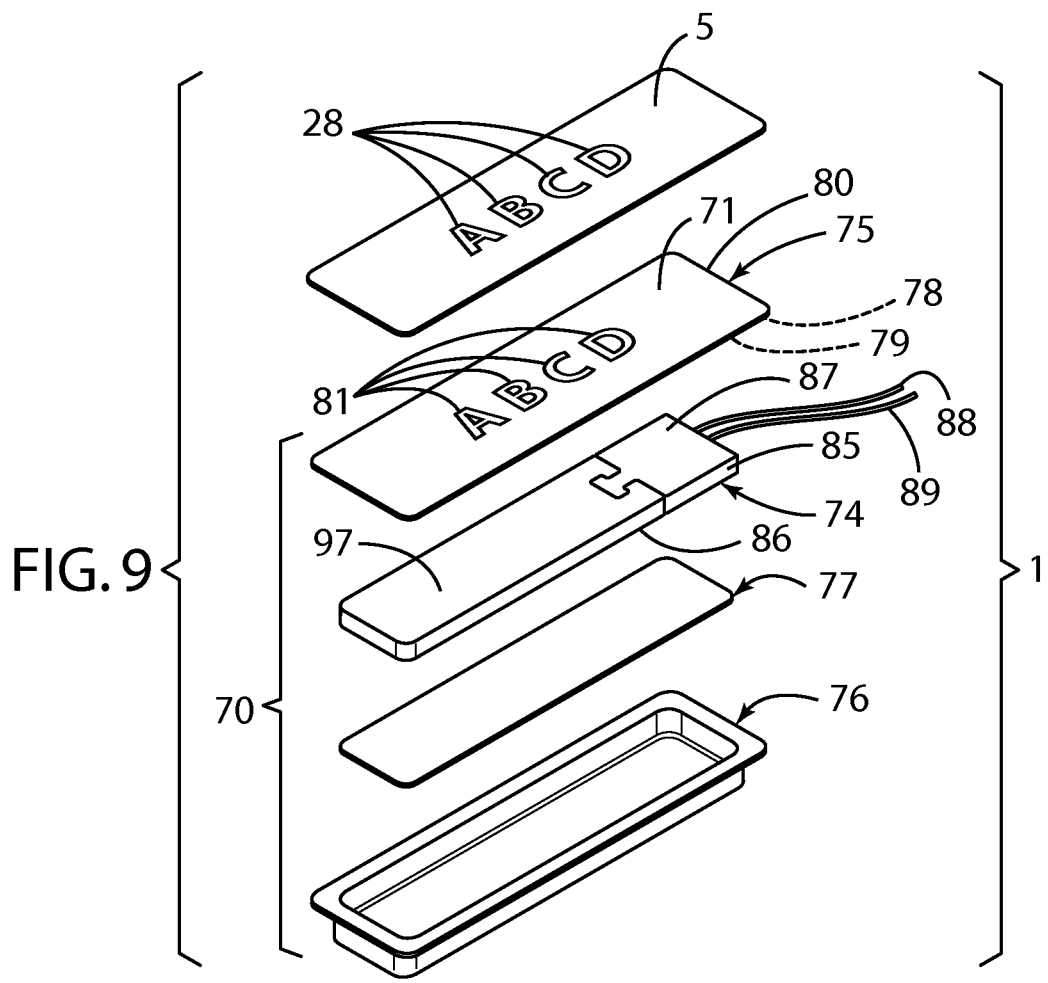

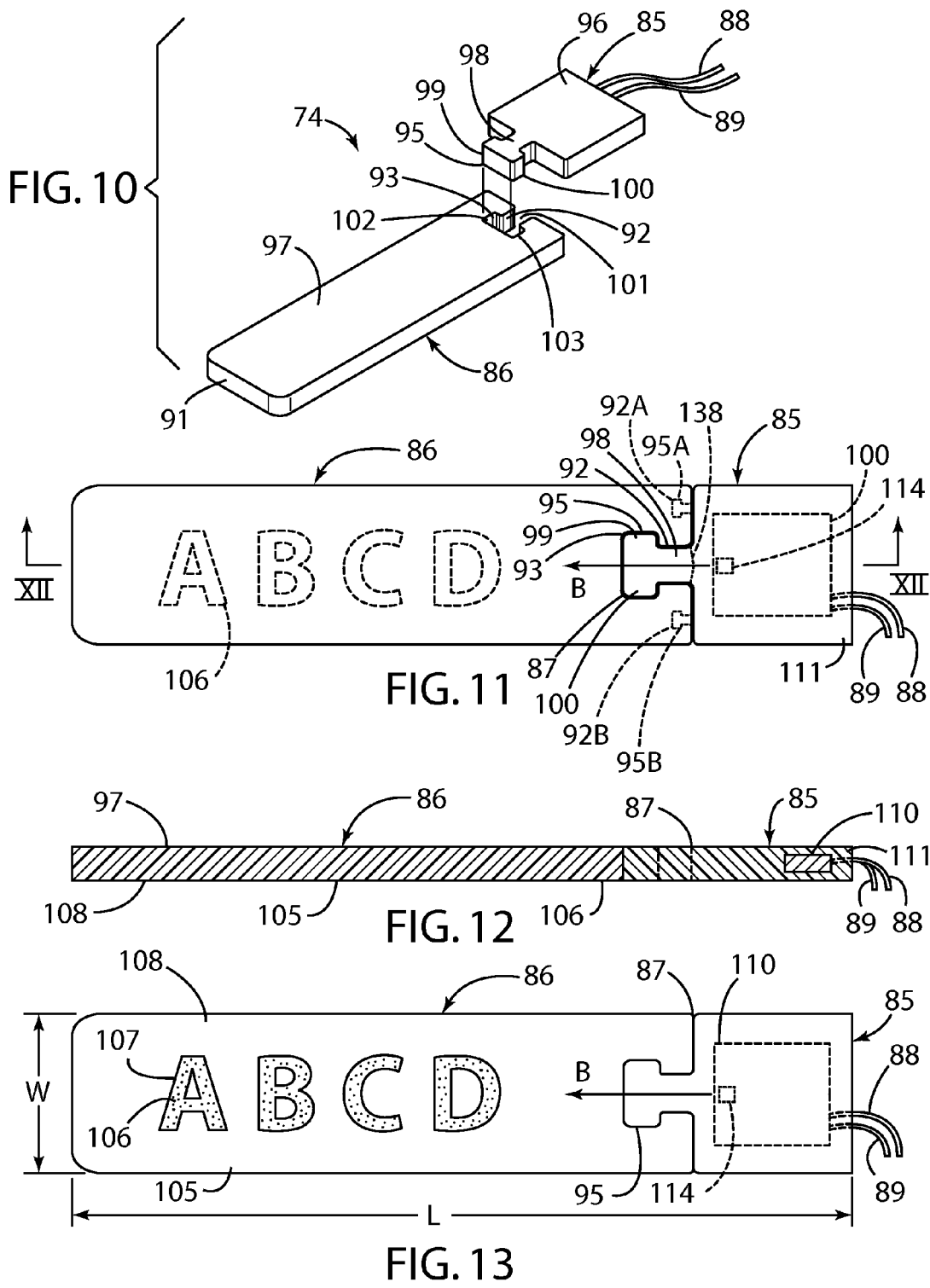

LIGHTED TRIM ASSEMBLY AND PERFORATED MEMBER THEREFOR

CROSS-REFERENCE TO RELATED APPLICATIONS

This application claims the benefit of U.S. Provisional Patent Application No. 61/719,788 filed on Oct. 29, 2012, entitled LIGHTED TRIM ASSEMBLY and U.S. Provisional Patent Application No. 61/830,403 filed on Jun. 3, 2013, entitled LIGHTED TRIM ASSEMBLY AND PERFORATED MEMBER THEREFOR. The present application is also a continuation of PCT Application No. PCT/US13/67080 filed on Oct. 28, 2013, entitled LIGHTED TRIM ASSEMBLY AND PERFORATED MEMBER THEREFOR. The entire contents of each of which are incorporated herein by reference.

BACKGROUND OF THE INVENTION

Various types of lighted trim assemblies have been developed for motor vehicles. Examples include lighted badges or emblems, lighted door sills, lighted mirrors, and other such lighted components.

SUMMARY OF THE INVENTION

One aspect of the present invention is a trim member for motor vehicles and the like. The trim member may comprise a perforated metal member. The trim member may be utilized in a lighted assembly according to another aspect of the present invention. The lighted assembly may comprise a trim assembly for motor vehicles or the like. Alternatively, the lighted assembly may comprise a stationary item such as an interior or exterior sign for buildings.

The assembly may include a perforated light-transmitting member having a plurality of holes or apertures therethrough. The perforated member may be made from an opaque material having front and rear sides such that light incident on the rear side is transmitted solely through the holes or apertures. The perforated member may comprise metal, polymer, composites or other suitable material. The perforated member may be made from sheet metal such as low carbon steel, stainless steel, titanium, aluminum, or other suitable materials. The sheet metal may initially comprise a flat sheet having a generally uniform thickness. The perforated member may be shaped by stamping or other forming process to provide a trim member for use in a vehicle door sill, lighted interior vehicle component, lighted exterior vehicle component, a stationary sign for building interiors or exteriors or other applications.

The holes through the perforated member may be circular, triangular, square, or virtually any other shape. All of the holes may have the same size, shape, and orientation. Alternatively, some of the holes may have different sizes and shapes. For example, some holes could be circular, and other holes could be triangular. The holes may, optionally, be uniformly spaced apart to form linear rows of openings. Alternately, the holes may be irregularly spaced, and the holes need not be arranged in linear rows.

At least some of the holes through the perforated member may be more closely spaced together in some areas or regions than in other areas or regions and arranged to form areas or regions. The areas or regions may have shapes forming letters, numbers, or other designs. In general, the perforated member may include one or more first regions having a plurality of openings therethrough, and one or more second regions without openings, wherein the first and second regions are separated by a perimeter or boundary. The perimeter or boundary may optionally form an outline of a letter, number, or other design element.

The letter, number, or other design may include one or more "islands" comprising regions or areas that do not have holes therethrough. For example, the first region may form the letter "A," and have a triangle shaped region forming an "island." The "islands" may define a second perimeter or boundary. The metal perforated member and the lettering and patterns and symbols provided thereon can be formed as a single integral piece. This advantageously means that it is not necessary to punch lettering, symbols or other patterns in the metal member and relocate non-perforated sections ("islands") in the part. This seeks to ensure that the position of the supported sections can be more accurately located. The perforated metal member may, for example, be formed of or comprise stainless steel, titanium, aluminum, copper, brass, zinc or any other suitable metallic material. Non-metallic materials may also be utilized depending upon application.

At least some of the holes through the perforated member may optionally be infilled with a suitable material. The material may comprise a thermosetting polymer, a thermoplastic polymer, or suitable non-polymer material. The infill material is preferably a transparent or colored light-transmitting material that provides for illumination of the first regions when the perforated member is backlit. All of the holes forming a first region corresponding to a letter, number, or other design may be infilled with a light-transmitting polymer material. Alternatively, only selected ones of the openings in a first region may be filled with a polymer material. The polymer material utilized to fill the holes may comprise a resin such as an epoxy, acrylic, polyurethane, or other suitable material. Alternatively, the polymer material utilized to infill the holes may comprise a thermoplastic polymer material. The thermosetting or thermoplastic polymer material may be light-transmitting, or it may be opaque. The polymer material may be transparent, or it may be colored.

The perforated member may include one or more shallow depressions or cavities in the areas that include the holes. The cavity may define a perimeter having a shape defining a letter, number, or other design element. If the perforated member comprises a metal material, the depression or cavity may be formed by embossing, stamping, or other suitable metal forming processes. If the depression or cavity is created by embossing or stamping, the perforated member may have substantially uniform metal thickness in the areas that are embossed to form the shallow cavity (or cavities) and in the areas that are not embossed.

Alternatively, the cavity or depression may be formed in the perforated member by chemical etching. If the depression or cavity is formed by a chemical etching process, the metal defining the depression or cavity has a reduced thickness relative to the other regions of the metal item, and the depression defines a depth. The depth of the depression or cavity may be uniform, or the depth of the depression or cavity may be non-uniform. The surfaces of the metal defining the depression or cavity may be planar or non-planar. The depth of the cavity may optionally be less than half a thickness of the metal in other areas of the perforated member.

The openings through the perforated member may be formed by chemical etching processes, or the openings may be formed utilizing other processes such as conventional punching operations, laser cutting, water jet cutting, etc. The shallow depression or cavity may be formed by embossing or other metal forming operations, and the holes may be formed by chemical etching. Alternatively, the shallow depression or cavity may be formed by chemical etching processes, and the holes may also be formed by chemical etching processes. Alternatively, the depression or cavity may be formed by a chemical etching process, and the openings may be formed by metal cutting processes.

Still further, the shallow cavity or depression may be formed utilizing other types of metal removal processes. For example, the shallow cavity or depression may be formed by an electrical discharge machine (EDM) process. The holes could then be formed utilizing a chemical etching process or a metal cutting process.

The cavity or depression and the holes formed by any of the above processes or any combinations of the above processes may be infilled with a polymer material as discussed above. The polymer material utilized to infill the cavity and holes may form an outer surface that is generally coplanar with the metal surface of the perforated member adjacent the cavity. Alternatively, the polymer material may define an outer surface that protrudes above the surface of the surrounding metal, or the polymer material may not completely fill the cavity such that the surface of the polymer material is lower than the surface of the metal item surrounding the polymer infill material.

Another aspect of the present invention is a perforated member having a plurality of openings therethrough, with a light source providing a back light whereby at least some of the light is transmitted through the openings in the item. The perforated member may be made from metal or other suitable material. The openings through the perforated member may form letters, numbers, or other such designs, and the openings may thereby form illuminated letters, numbers, or other designs. The openings are preferably sufficiently small and sufficiently close together to provide a substantially uniformly lighted area in the regions of the openings. Thus, the individual openings are not visible to the naked eye at normal viewing distances (e.g. distances greater than 1 or 2 feet).

Also, the formation of letters, numbers, or other designs is optional in a backlit assembly according to the present invention. For example, substantially the entire area of the perforated member may include openings therethrough, such that substantially the entire perforated member is illuminated when viewed from the front side of the perforated member. Also, a backlit assembly may optionally include polymer infill of the openings, or the openings could remain open, without infill material. Furthermore, a perforated member and backlit assembly may optionally include shallow depressions and openings that are both infilled with polymer material. However, the perforated member of a backlit assembly need not include a shallow depression or cavity, and may comprise only a plurality of openings that provide for transmission of the light through the perforated member. As discussed above, the perforated member may comprise metal or other suitable material.

Another aspect of the present invention is a back lit assembly including a perforated member having a plurality of openings therethrough, and an LED light source providing light that is transmitted through the openings in the perforated member. The perforated member may comprise metal or other suitable material. The openings may be infilled with a polymer material, or the openings may be open, without infill. The LED light source may comprise one or more LEDs that transmit light into a light transmitting member or "light pipe." The light pipe may be configured to distribute the light to the perforated member such that the light passes through the openings in the perforated member. The light pipe may comprise a polymer material that provides for internal reflection of light from the LED light source in at least some areas of the light pipe, and also provides for escape of the light in at least some areas whereby the light is transmitted through the openings in the perforated member. The LED light source may optionally be encapsulated in a thermoplastic polymer material. The light pipe and LED light source may be disposed within a housing that is secured to the perforated member to provide a water tight cavity.

BRIEF DESCRIPTION OF THE DRAWINGS

FIG. 1 is a view of a lighted door sill assembly for a motor vehicle according to one aspect of the present invention;

FIG. 2 is an enlarged view of a portion of the lighted door sill assembly of FIG. 1;

FIG. 3 is a cross sectional view of the door sill assembly of FIG. 1 taken along the line III-III;

FIG. 3A is a cross sectional view of a partially formed trim member for the door sill assembly of FIG. 3;

FIG. 3B is a cross sectional view of a partially formed trim member for the door sill assembly of FIG. 3;

FIG. 3C is a partially fragmentary cross sectional view of a portion of a metal blank and masks utilized in a chemical etching process to form cavities and/or openings in the metal blank;

FIG. 3D is a partially fragmentary cross-sectional view of a perforated metal member formed from a metal blank as shown in FIG. 3C;

FIG. 4 is an end view of the door sill of FIG. 1;

FIG. 4A is a fragmentary view of a portion of a lighted door sill according to another aspect of the present invention;

FIG. 9 is an exploded isometric view of the lighted doorsill assembly of FIG. 1;

FIG. 10 is an exploded isometric view of the light guide and light source of FIG. 9;

FIG. 11 is a top plan view of the light guide and light source assembly of FIG. 10;

FIG. 12 is a cross-sectional view of the light guide and light source assembly of FIG. 11, taken along the line XII-XII; and FIG. 13 is a bottom plan view of the light guide and light source assembly of FIG. 12.

DETAILED DESCRIPTION

Figure 8:
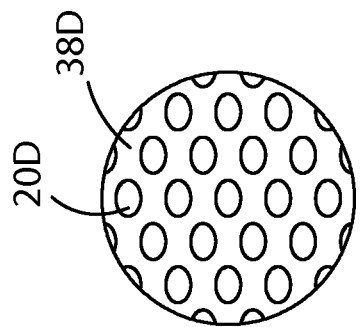
FIGS. 5-8 are enlarged views of perforated members having various hole shapes and patterns that may be utilized with a lighted trim assembly according to other aspects of the present invention.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

With reference to FIG. 1, a lighted trim assembly such as a lighted door sill assembly 1 includes a perforated trim member 5 that may be formed from a thin sheet metal or other suitable material. For example, the trim member 5 may be formed from steel or aluminum sheet material. With reference to FIG. 3, the perforated trim member 5 may include a generally planar main wall or web portion 6 and flanges 8A and 8B that extend from central wall or web 6 at an angle θ of about 30-60°. Main wall or web 6 includes a center portion 10 that may be deformed by stamping or embossing to form a plurality of shallow cavities or depressions 12 on outer side 14 of main wall or web 6, and a corresponding raised portion 16 on inner side 18 of main wall or web 6. A web 15 forms a base of cavities 12. As discussed below, cavities 12 are utilized to form letters 28A-28E and/or other designs or features such as U-shaped regions 22A and 22B (FIG. 1). A plurality of openings or apertures 20 (see also FIG. 2) may be formed in the web 15 forming the base of depressions 12. The cavities 12 and openings 20 may be filled with a light-transmitting polymer material 42. The polymer material 42 closes off or seals openings 20, but allows light from light source 36 (FIG. 4) to pass through openings 26 to thereby illuminate letters 28A-28E and/or U-shaped regions 22A and 22B and/or designs or regions.

With reference to FIG. 3A, depression 12 and flanges 8A and 8B may be formed in a sheet metal blank 4 utilizing conventional dies or other suitable metal forming tools/techniques. The formed blank 4 includes planar outer portions 13A and 13B extending around shallow cavity 12, and a central planar web 15 forming a base of cavity 12. Transversely extending portions 17A and 17B extend between central web 15 and planar outer portions 13A and 13B. Referring again to FIG. 1, the transverse portions 17A and 17B form boundaries or perimeters 17 extending around cavities or depressions 12. The perimeters 17 of cavities or depressions 12 have a shape corresponding to the perimeters of letters 28A-28F and U-shaped regions 22A and 22B.

After cavities or depressions 12 are formed, the openings 20 (FIG. 3B) may then be formed in web 15 utilizing chemical etching, punching/cutting, laser cutting, or other suitable methods. It will be understood that the openings 20 may be formed before the cavities or depressions 12 are formed. After the shallow cavity or depression 12 and openings 20 are formed, polymer material 42 (FIG. 3) is utilized to fill the shell cavity 12 and openings 20. However, it will be understood that the openings 20 and/or shell cavity 12 need not be filled with a polymer material according to other aspects of the present invention.

Referring to FIG. 3B, the perforated trim member 5 may be positioned with outer side 14 facing upwardly, and a barrier member 46 may be positioned against inner side 18 of planar web 15 to thereby close off openings 20. The barrier member 46 may comprise a relatively thin sheet of material that is temporarily secured to side surface 18 utilizing low strength adhesive of the type normally utilized for tape or the like. Alternatively, barrier member 46 may comprise a rigid member that is clamped or pressed against surface 18. A thin sheet of polymer, paper, or other material (not shown) may optionally be positioned between barrier member 46 and inner side 18 of web 15. If the polymer material 42 comprises a thermosetting resin or the like, the polymer material can be poured into the cavity 12 whereby the polymer material runs into the openings 20, and forms an outer surface 50 (FIG. 3) that is generally coplanar with the adjacent planar outer metal surfaces 14.

Alternatively, the polymer material 42 may comprise a thermoplastic polymer material. If a thermoplastic polymer material is utilized, a second barrier member 48 (FIG. 3B) may be positioned across shell cavity or depression 12. If a thermoplastic polymer is utilized, the barrier members 46 and 48 may comprise rigid metal members that are clamped together. Molten thermoplastic material is then injected into cavity 12 through a port 52 in barrier member 48. The barrier members 46 and 48 may then be removed.

As discussed above, the shallow depression or cavity 12 may be formed by embossing, stamping, or other metal forming operations. With further reference to FIGS. 3C and 3D, a cavity 12A may also be formed utilizing a metal etching process. The openings 20A may also be formed by a metal etching process, or the openings 20A may be formed by conventional punching or cutting operations, or utilizing EDM operations. During the etching process, the metal blank 4A may be provided with a mask 19 on a first side thereof, e.g. a first or top side 3. The mask 19 may be adhesively secured, clamped, or otherwise positioned on top surface 3 of blank 4A. Mask 19 includes one or more openings 21 with edges 23. Openings 21 in mask 19 expose surface areas 25 of blank 4A. Edges 27 of surface areas 25 are defined at the edges 23 of openings 21 in mask 19. Mask 19 may comprise a thing sheet of material that is resistant to the chemicals used to etch metal blank 4A. It will be understood that the mask 19 may comprise material that is much thinner than metal blank 4A, and the thickness of mask 19 is exaggerated in FIG. 3C in order to more clearly show the opening 21 and edges 23. The edges 27 of exposed surface areas 25 correspond to edge or side surfaces 12B (FIG. 3D) of depression or cavity 12A, and the edges 12B correspond to the boundaries or peripheries 29 of the lettering 28A-28C, symbol or patterns 22A and 22B, etc.

On a second side 7 of the metal blank member 4A, a further mask 19A (FIG. 3C) may be provided in which perforations 31 are provided to form openings 20A (FIG. 3D) in the regions of the lettering 28A-28C, symbols or patterns 22A, 22B, etc. Once the mask 19A has been applied to the metal member 4A, a suitable etching solution, e.g. an acid or other such solution, may be used to etch the perforations 20A through the material exposed by the mask 19A on the second side 7 of the metal member 4A. A shallow cavity or depression 12A (FIG. 3D) is formed in the metal member 4A on the first side 3 of the metal member 4A. This is because the mask 19 provided on this first side 3 only defines the perimeter 29 of the lettering, symbols or other such patterns. The perforations 20A formed from the second side 7 extend from the second opposing surface 7 of the metal member 4A to the base surface 33 of the depression or recess 12A.

In the case of etching of the metal member 4A, the metal member 4A may be etched to half the thickness D of the metal member 4A from the first side 3 through the mask 19 provided thereon. The depth of the perforations 20A may be substantially equal to the depth D of the recess 12A formed on the first side 3. Using a chemical etching process seeks to prevent surface imperfections on the resultant component as may be the case when using conventional machining or metal forming processes. The perforations 20A are of such a size and spaced from one another so that light may pass through these regions evenly and uniformly. Furthermore, from a distance of half a meter or more, the through holes 20A appear to become invisible to the naked eye. The metal member 4 or 4A and the depressions 12 or 12A and/or the perforations therein may be filled with an infill material. The infill material may be provided as a liquid, for example a material which is molten when heated, and may permeate into the through holes 20A in order to provide a component which prevents the ingress of water in the areas of the perforations 20A. The infill material may comprise a polymer material. The polymer material may comprise a resin such as an epoxy, acrylic, polyurethane, or any other suitable material. The polymer material may a light transmitting material or it may be opaque. The infill material may be fully transparent, translucent and/or may be colored depending on the application.

The blank 4A may be formed from metal having a thickness "T", and the cavity or depression 12A may define a depth "D". The depth "D" is optionally less than one half the thickness "T" of the metal blank 4A. The cavity or depression 12A and openings 20A may be filled with polymer material as described above. A barrier member 46A (FIG. 3D) may be utilized to close off openings 20A, and a thermosetting polymer material may be poured into cavity 12A whereby the thermosetting polymer material flows into openings 20A prior to hardening. Alternatively, barrier members 46A and 48A may be closed off by rigid barrier members 46A and 48A, and molten thermoplastic polymer material may be injected into cavity 12A and openings 20A through port 52A in barrier member 48A. The barrier members 46A and 48B may comprise rigid metal structures that are clamped together.

An assembly comprising the metal member 4 or 4A and a light source 36 may be provided in a vehicle, for example, as a door sill 1 (FIG. 1). The use of a metal member seeks to ensure sufficient strength to the assembly and thus protection, in use, for the internal light source 36. The metal member 4 or 4A and an assembly comprising the same may have other applications. These applications could include assemblies for use in vehicle doors or interior surface trim components such as dashboards. The assembly may have non-automotive applications. Applications may include aerospace, industrial, or domestic applications where a metal member is preferred to provide some structural integrity to provide display elements, such as signs for example.

Referring to FIG. 2, the holes 20 may have a diameter of 0.028 inches, with equal spacing of 0.028 inches between the holes 20. As discussed in more detail below, the shapes sizes, spacing, etc. of the openings 20 may vary according to the requirements of a particular application. Referring again to FIG. 1, the cavities 12 and openings 20 may form regions 22A and 22B that have an elongated, narrow U-shape, with a contour that is similar (but smaller) than a perimeter 26 of perforated trim member 5. The cavities 12 and openings 20 may also be utilized to form regions such as letters 28A-28F. The letters 28A-28F (or numbers) may be utilized to spell/designate a vehicle make and/or model, or other design or message. The perimeters 17 of cavities 12 may have virtually any shape as required to form letters 28A-28F and/or other designs 22A, 22B. Letters 28A-28E may form "islands" such as triangle-shaped portions 24A-24E utilized to form the letters "A". It will be understood that other letters (e.g. "B", "b", "D", "d"), or numbers (e.g. "0", "4", "6", "8"), or other designs having islands may be formed according to other aspects of the present invention.

Perforated member 5 may optionally be made from metal, or the perforated member 5 may be made from other materials. Specifically, perforated member 5 may be molded from a polymer material. The cavity 12 and/or holes 20 may be formed at the time the perforated member 5 is molded. The perforated member 5 may then be covered or plated with a thin layer of metal utilizing known techniques to provide the appearance that the part is made from metal. The perforated member 5 may be formed by injection molding utilizing a suitable thermoplastic polymer material.

With further reference to FIG. 4, a housing 30 may be secured to rear side 18 of perforated trim member 5. Housing 30 is generally hat-shaped in cross-section, with flanges 32A and 32B that sealingly attach to inner side 18 of perforated trim member 5 to form a cavity 34. An optional sheet of material 54 may be disposed between flanges 32A and 32B of housing 30 and perforated member 5. The sheet member 54 may comprise transparent polymer or other suitable material. The sheet or layer 54 may be adhesively secured to the perforated member 5, and the flanges 32A and 32B of housing 30 may be adhesively secured to the optional sheet member 54. With further reference to FIG. 4A, the flanges 32A and 32B of a housing 30A according to another aspect of the present invention include an elongated raised area 50 and a corresponding cavity or channel 60 that receives adhesive 56. The adhesive cavity or channel 60 may extend around substantially the entire perimeter of housing 30, and may optionally be utilized to improve the adhesion/seal between housing 30 and optional sheet 54A. A light source 36 is disposed within cavity 34. Light source 36 may comprise a light source 85 comprising one or more LEDs and an elongated illuminated polymer member ("light pipe") 97, and an upper member or appliqué 75 as discussed in more detail below in connection with FIGS. 9-13 and as disclosed in U.S. Pat. No. 7,712,933, the entire contents of which are incorporated herein by reference. Light source 36 may comprise an elongated member or assembly 84 (FIG. 9) that extends along the length of perforated member 5 behind regions 22A-22B and regions 28A-28F. The optional sheet 54 (FIG. 4) may comprise an upper member 75 (FIG. 9), or the lighted assembly 1 may include both an upper member or appliqué 75 and an optional sheet 54 disposed directly above an upper member or appliqué 75. Light source 36 may comprise other types of LEDs or other lights as required for a particular configuration. When the light source 36 is illuminated, the light from light source 36 travels through openings 20 to thereby illuminate the regions 22A, 22B, and 28A-28F (FIG. 1).

Referring again to FIG. 2, a web 38 is formed around openings or apertures 20, such that the regions 22A-22B and 28A-28F allow some light to pass through. However, the web 38 provides structural support for "islands" or other areas such as the triangles 40 formed by the letters "A" 28A-28E. Also, the openings 20 may provide a pleasing non-uniform (e.g. dotted) light across the regions 22A-22B and 28A-28F if the openings are large enough and/or spaced apart enough. Alternatively, if the openings 30 are sufficiently close together, and the openings 20 are sufficiently small (e.g. as shown in FIG. 2), the regions 22A-22B and/or 28A-28F will appear to be uniformly illuminated to the naked eye when viewed from a distance greater than about 1-2 feet.

Referring again to FIG. 3, the depression 12 and openings 20 may be filled with a light-transmitting polymer material 42 as discussed above. The polymer material 42 may comprise a transparent/clear material, or it may comprise a translucent polymer material having a particular color as required for a particular application. The polymer material 42 seals the openings 20 and prevents entry of water into the cavity 34 of housing 30. If required for a particular application, the polymer material 42 may form a layer 44 (shown in dashed lines in FIG. 3) that extends over substantially the entire outer side 14 of perforated trim member 5. It will be understood that depression 12 is an optional feature, and the entire wall/web 6 may be substantially planar.

The polymer material 42 may be configured to diffuse the light being transmitted through openings 20 to thereby reduce or eliminate the ability of a user to discern the individual spots 20 whereby the regions 22A-22B and/or 28A-28F form substantially continuous, lighted regions. Also, the polymer material 42 may include photoreactive additives that generate or change visible light to alter the color and/or other aspects of the appearance of the lighted regions.

Figure 7:
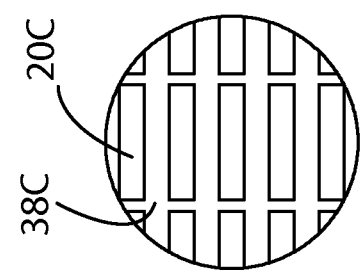
Figure 6:
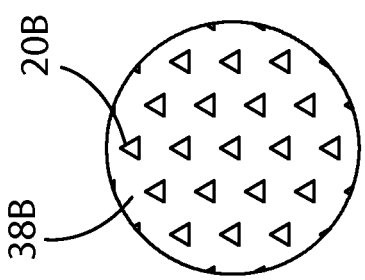
Figure 5:
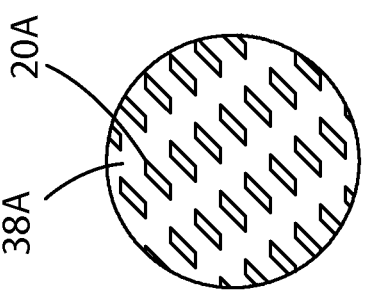

With further reference to FIGS. 5-8, the openings in perforated member 5 may have different shapes 20A-20D, respectively. With reference to FIG. 5, openings 20A comprise small parallelograms arranged in rows. With reference to FIG. 6, openings 20B comprise small triangles arranged in rows. With reference to FIG. 7, the openings may comprise rectangular openings 20C arranged in rows. With reference to FIG. 8, the openings may comprise elliptical or oblong openings 20D arranged in rows. The openings 20A-20D form webs 38A-38D around the openings 20A-20D, respectively, that provide support for small "islands" such as triangles 40 (FIG. 1) that may be needed to form letters, numbers, or other designs of interest. The sizes and/or spacing of openings 20-20D may be varied as required for a particular application to provide a desired appearance. Also, the openings 20-20D may be spaced in arrangements other than linear rows. Still further, the perforated member 5 may include openings having more than one size and/or shape. For example, perforated member 5 could include some openings 20A (FIG. 5) and/or openings 20B (FIG. 6) and/or openings 20C (FIG. 7) and/or openings 20D (FIG. 8) and/or other openings in virtually any combination.

As discussed above, perforated trim member 5 may be made of thin sheet metal or the like that is deformed to have the cross sectional shape shown in FIG. 3 by stamping or other suitable process. The openings 20 may be formed by conventional punching/stamping operations, laser cutting, or other suitable process. In a preferred process, the openings 20-20D are formed by a chemical etching process that provides a precise finished appearance without causing deformities or other imperfections that may result from conventional punching or other such forming processes.

With reference to FIG. 9, light source 36 may comprise a light assembly 70 that includes a perforated member 5, a light source/guide assembly 74, an upper member or appliqué 75 forming upper surface 71, a housing or backing member 76 corresponding to housing 30 (FIG. 4), and an optional reflective layer or member 77. Perforated member 5 may include a plurality of perforated regions forming letters 28 or designs as described in more detail above in connection with FIGS. 1-8. It will be understood that perforated member 5 may have substantially the same shape/configuration as shown in FIGS. 1-8, and the light source 74, upper member 75, optional reflective layer 77, and housing/backing member 76 may be shaped and sized as required for the lighted assembly 1, or for other applications according to other aspects of the present invention.

The upper member 75 is made of a thin sheet of polycarbonate or other suitable polymer material having a thickness of about 1.0 mm to 2.0 mm. In the illustrated example, upper member 75 is about 1.5 mm thick. The upper member 75 may be made from a layer or sheet 80 of polymer material having light-transmitting properties, and ink 78 or other light-blocking material is applied to a lower surface 79 of the sheet of material 80, leaving areas 81 without ink 78, such that light from light source/guide assembly 74 may be transmitted through the areas 81. The areas 81 may form letters, designs, or the like. In particular, the areas 81 may form letters 28A-28F or designs 22A-22B as shown in FIG. 1. The areas 81 are preferably about the same size and shape as the letters 28A-28F and designs 22A-22B. The upper surface 71 of sheet 80 may comprise a protective coating of wear-resistant material to improve durability of the light assembly 70. One example of a suitable material for the coating or layer of surface 71 is SERIGLAZE® product available from Serigraph, Inc. of West Bend, Wis. The sheet 80 is preferably a clear or translucent material. In particular, the sheet 80 may comprise a white polymer material that provides sufficient light transmission capability to illuminate the areas 81, while simultaneously not permitting a user to view the light source/guide assembly 74 and/or vacuum member and reflective member 77 through the areas 81.

The light source/guide assembly 74 includes a light source 85 that is connected to a light guide 86 at a joint 87. Electrical lines 88 and 89 extend from the light source 86, and connect to a conventional 12 volt vehicle electrical power supply.

With further reference to FIG. 10, the light source/guide assembly 74 includes a light guide 86 and a light source assembly 85. The light guide 86 may be formed from a sheet of acrylic material or other suitable polymer having a relatively uniform thickness. The thickness of the light source 85 and light guide 86 will vary depending upon the requirements of a particular application. In the illustrated example, light source 85 and light guide 86 have a thickness in the range of about 2.0-4.0 mm, and more preferably about 3.0 mm. However, light source 85 and light guide 86 could have different thicknesses. In the illustrated example, the light guide 86 is cut from a large sheet of material to form a perimeter 91 including a recess such as inwardly-extending portion 92 with a surface 93 having a shape that closely corresponds to a protrusion 95 of light source assembly 85. The light guide 86 may be formed by laser-cutting, sawing, or otherwise cutting a sheet of polymer material. The light guide 86 may also be molded utilizing a suitable polymer material or the like. As described in more detail below, the light source assembly 85 includes one or more LEDs and other electrical components that are molded into polymer body 96. In the illustrated example, the light guide 86 comprises a generally rectangular prism, with the exception of the inwardly-extending portion 92. Light from the light source assembly 85 is reflected internally within the light guide 86, and subsequently escapes from the upper surface 97 and through the areas 81 (FIG. 9) of upper member 75.

The protrusion 95 of light source 85 is configured to be closely received within the recess or inwardly-extending portion 92 of perimeter 91 of light guide 86 to thereby mechanically and optically interconnect the light source assembly 85 and light guide 86. In the illustrated example, the protrusion 95 is generally T-shaped in plan view (FIG. 11), with a first portion 98, and transversely-extending portions 99 and 100. The inwardly-extending portion 92 of light guide 86 includes a first portion 101 corresponding to the first portion 98 of protrusion 95, and side portions 102 and 103 corresponding to transverse portions 99 and 100, respectively, of protrusion 95 of light source assembly 85. The protrusion 95 may be dimensioned slightly larger than the inwardly-extending portion 92 of perimeter 91 of light guide 86 to thereby form an interference fit to mechanically interconnect the light source assembly 85 to the light guide 86 without the use of adhesives. Adhesive material (not shown) may optionally be applied to the protrusion 95 and/or inwardly-extending portion 92 immediately prior to assembly to provide for secure connection between the light source assembly 85 and light guide 86. Also, to ensure that the light source assembly 85 is optically coupled to the light guide 86, a small amount of light-transmitting material such as a clear sealant or adhesive material may also be applied to the protrusion 95 and/or inwardly-extending portion 82 of perimeter 91 at the time of assembly.

With further reference to FIGS. 11-13, light guide 86 includes irregular surface portions 106 that form a dispersion pattern that causes light from the light source assembly 84 to be dispersed within light guide 86 towards upper surface 97 of light guide 86, such that the light escapes from upper surface 97 of light guide 86. In the illustrated example, the boundaries or outlines 107 of the dispersion patterns 106 are in the form of letters. The boundaries of the letters of FIGS. 9-13 may have substantially the same size and shape as the boundaries 29 of the letters and designs of FIG. 1. The outlines 107 may have a shape that is substantially similar to the light-transmitting areas 81 (FIG. 9) of upper member 75. The dispersion pattern 106 may have the same size and shape as areas 81, or it may be somewhat larger or smaller. In general, the dispersion pattern 106 may be somewhat larger than the areas 81 to ensure that the areas 81 are fully illuminated, and has a similar shape to provide for efficient dispersion of light adjacent light-transmitting areas 81 of upper member 75. In the illustrated example, the dispersion pattern 106 is formed on lower surface 105 of light guide 86 by a laser. The dispersion pattern 106 comprises a plurality of small surface irregularities such as low spots, high spots, or a combination of both, produced by a laser incident upon the lower surface 105. It will be understood that the boundary line 107 is provided for purposes of illustrating the outline of the dispersion pattern 106 relative to the adjacent smooth portions 108 of lower surface 105 of light guide 86, but the dispersion pattern does not necessarily include an actual line 107 formed on light guide 86.

With reference to FIG. 12, light source assembly 85 includes an internal electrical assembly 110 that is embedded in a polymer body 111. The electrical assembly 110 may include conductive circuit elements and one or more electrical components such as resistors, diodes, capacitors, or the like that are soldered or otherwise electrically and/or mechanically connected to the circuit elements. In the illustrated example, the electrical components include a side-emitting LED 114 (FIG. 11) that is configured to emit light in the direction of the arrow "B", and one or more additional electrical components that are also secured to the conductive elements. One or more conductive lines 88 and 89 supply power to the circuit elements, and extend outside of the polymer body 111. The side-emitting LED 114 and/or other electrical components may be secured to the circuit elements and molded into the polymer body 111 according to the arrangement disclosed in U.S. Pat. No. 7,909,482.

In the example described above, the trim assembly comprises a lighted door sill assembly 1 (FIG. 1). However, it will be understood that the trim assembly may comprise a lighted badge, exterior trim, or other vehicle component. Still further, the illuminated device according to the present invention may comprise other illuminated components for use in applications other than motor vehicles. For example, lighted decorative or trim elements for buildings, signs, and the like could also be formed utilizing the structures and processes described in more detail above.

We claim:

1. A method of manufacturing a perforated member comprising:
providing a metal sheet:
masking a first side of the metal sheet to expose one or more defined areas;
masking the second side of the metal sheet with a mask on the opposing sides of the one or more defined areas, the mask on the second side comprising a plurality of perforations within the one or more defined areas;
etching the metal member to form a plurality of perforations through the metal member for the transmission of light through the perforations;
infilling the perforations through the metal member by causing molten light-transmitting thermoplastic polymer infill material to flow into the perforations; and
cooling the light-transmitting infill material after the light-transmitting thermoplastic polymer infill material flows into the perforations to solidify the thermoplastic polymer infill material to form a light-transmitting solid material.

2. The method of claim 1; wherein:
the perforations through the metal member in each of the one or more defined areas are formed evenly spaced.

3. The method of claim 1; wherein:
the perforations through the metal member are circular, or triangular, or oval, or square, or rectangular.

4. The method of claim 1; wherein:
the perforations through the metal member have a mean diameter of less than 0.75 mm, or less than 0.5 mm or less than or equal to 0.25 mm.

5. The method of claim 1; wherein:
the one or more defined areas form letters, symbols, or patterns.

6. The method of claim 1, wherein:
the light-transmitting solid material extends fully across the defined areas to prevent ingress of water through the perforations through the metal member provided in the one or more defined areas.

7. The method of claim 1, wherein:
the light-transmitting solid material comprises a sealing material.

8. The method of claim 1 wherein:
the light-transmitting infill material is coloured, transparent, and/or translucent.

9. A method of manufacturing a perforated member comprising:
providing a metal sheet:
masking a first side of the metal sheet to expose one or more defined areas;
masking the second side of the metal sheet with a mask on the opposing sides of the one or more defined areas, the mask on the second side comprising a plurality of perforations within the one or more defined areas;
etching the metal member to form a cavity having a base surface that is recessed from the first side of the metal sheet;
etching the metal member to form a plurality of perforations through the metal member for the transmission of light through the perforations, wherein the perforations form first openings in the base surface of the cavity and second openings in the second side of the metal sheet;
clamping barrier members onto the first and second sides of the metal sheet to close off the cavity and the second openings;
infilling the perforations through the metal member by injecting light-transmitting molten thermoplastic polymer material into the cavity;
cooling the thermoplastic polymer material to form light-transmitting solid material.

10. A method of manufacturing a perforated member, the method comprising:

forming a plurality of perforations through a metal member utilizing an etching process whereby the perforations define a first region; and at least partially filling at least some of the perforations by flowing a light-transmitting thermoplastic polymer material into the openings, followed by cooling the light-transmitting thermoplastic polymer material to solidify the thermoplastic polymer material.

11. The method of claim 10, including:

forming a depression in a first side of the metal member, the depression defining a boundary, wherein the plurality of perforations have openings disposed inside the boundary.

12. The method of claim 11, including:

at least partially infilling the depression and in the openings with the light-transmitting thermoplastic polymer material.

13. The method of claim 12, wherein:

the light-transmitting thermoplastic polymer material is transparent.

14. The method of claim 12, wherein:

the light-transmitting thermoplastic polymer material is colored.

15. The method of claim 10, including:

forming a depression such that the depression forms a ring around an inner region that does not include openings whereby the inner region defines an island.

16. The method of claim 10, including:

providing a light source;

positioning the light source adjacent to the metal member.

17. The method of claim 16, wherein:

the light source comprises at least one LED and at least one polymer member that receives light from the LED.

18. The method of claim 17, including:

configuring the polymer member to emit light directly adjacent the first region to thereby back light the first region.

19. The method of claim 18, wherein:

the first region comprises at least one of a letter and a number.

20. The method of claim 18, including:

attaching a housing to the metal member to form a watertight cavity, and:

positioning the light source in the watertight cavity.

21. The method of claim 16, including:

forming an illuminated area on the component by causing the light source to generate light that is transmitted through the light-transmitting material; and positioning the metal member so it extends along at least a portion of a lower edge of a door opening of a vehicle whereby the illuminated area is visible when a door of the vehicle is open.

* * * * *